(12) United States Patent
Sanko et al.

(10) Patent No.: US 11,530,913 B2
(45) Date of Patent: Dec. 20, 2022

(54) METHODS AND SYSTEMS FOR DETERMINING QUALITY OF SEMICONDUCTOR MEASUREMENTS

(71) Applicant: KLA Corporation, Milpitas, CA (US)

(72) Inventors: Dzmitry Sanko, Vallejo, CA (US); Min-Yeong Moon, Ann Arbor, MI (US); Stilian Ivanov Pandev, Santa Clara, CA (US)

(73) Assignee: KLA Corporation, Milpitas, CA (US)

( * ) Notice: Subject to any disclaimer, the term of this patent is extended or adjusted under 35 U.S.C. 154(b) by 147 days.

(21) Appl. No.: 17/030,690

(22) Filed: Sep. 24, 2020

(65) Prior Publication Data

US 2022/0090912 A1   Mar. 24, 2022

(51) Int. Cl.
*G01B 11/25* (2006.01)
*G01B 15/04* (2006.01)

(52) U.S. Cl.
CPC ............. *G01B 11/25* (2013.01); *G01B 15/04* (2013.01)

(58) Field of Classification Search
USPC ........................................................ 356/612
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,023,338 A | 2/2000 | Bareket |
| 6,429,943 B1 | 8/2002 | Opsal et al. |
| 6,716,646 B1 | 4/2004 | Wright et al. |
| 6,778,275 B2 | 8/2004 | Bowes |
| 6,787,773 B1 | 9/2004 | Lee |
| 6,992,764 B1 | 1/2006 | Yang et al. |

(Continued)

FOREIGN PATENT DOCUMENTS

| | | |
|---|---|---|
| EP | 3547031 A1 | 10/2019 |
| WO | 2012-092132 A2 | 7/2012 |

OTHER PUBLICATIONS

International Search Report dated Dec. 20, 2021, for PCT Application No. PCT/US2021/048591 filed on Sep. 1, 2021 by KLA-Tencor Corporation, 3 pages.

(Continued)

*Primary Examiner* — Sunghee Y Gray
(74) *Attorney, Agent, or Firm* — Spano Law Group; Joseph S. Spano (57) ABSTRACT

Methods and systems for estimating a value of a quality metric indicative of one or more performance characteristics of a semiconductor measurement are presented herein. The value of the quality metric is normalized to ensure applicability across a broad range of measurement scenarios. In some embodiments, a value of a quality metric is determined for each measurement sample during measurement inference. In some embodiments, a trained quality metric model is employed to determine the uncertainty of defect classification. In some embodiments, a trained quality metric model is employed to determine the uncertainty of estimated parameters of interest, such as geometric, dispersion, process, and electrical parameters. In some examples, a quality metric is employed as a filter to detect measurement outliers. In some other examples, a quality metric is employed as a trigger to adjust a semiconductor process.

20 Claims, 7 Drawing Sheets

(56) References Cited

U.S. PATENT DOCUMENTS

| | | | |
|---|---|---|---|
| 7,242,477 B2 | 7/2007 | Mieher et al. | |
| 7,321,426 B1 | 1/2008 | Poslavsky et al. | |
| 7,406,153 B2 | 7/2008 | Berman | |
| 7,478,019 B2 | 1/2009 | Zangooie et al. | |
| 7,626,702 B2 | 12/2009 | Ausschnitt et al. | |
| 7,656,528 B2 | 2/2010 | Abdulhalim et al. | |
| 7,826,071 B2 | 11/2010 | Shchegrov et al. | |
| 7,842,933 B2 | 11/2010 | Shur et al. | |
| 7,873,585 B2 | 1/2011 | Izikson | |
| 7,929,667 B1 | 4/2011 | Zhuang et al. | |
| 7,933,026 B2 | 4/2011 | Opsal et al. | |
| 8,068,662 B2 | 11/2011 | Zhang et al. | |
| 8,138,498 B2 | 3/2012 | Ghinovker | |
| 9,291,554 B2 | 3/2016 | Kuznetsov et al. | |
| 9,826,614 B1 | 11/2017 | Bakeman et al. | |
| 9,885,962 B2 | 2/2018 | Veldman et al. | |
| 9,915,522 B1 | 3/2018 | Jiang et al. | |
| 10,013,518 B2 | 7/2018 | Bakeman et al. | |
| 10,101,670 B2 | 10/2018 | Pandev et al. | |
| 10,152,678 B2 | 12/2018 | Pandev et al. | |
| 10,324,050 B2 | 6/2019 | Hench et al. | |
| 10,352,695 B2 | 7/2019 | Dziura et al. | |
| 10,365,225 B1 * | 7/2019 | Pandev | G01N 21/84 |
| 2003/0021465 A1 | 1/2003 | Adel et al. | |
| 2007/0176128 A1 | 8/2007 | Van Bilsen et al. | |
| 2007/0221842 A1 | 9/2007 | Morokuma et al. | |
| 2009/0152463 A1 | 6/2009 | Toyoda et al. | |
| 2011/0266440 A1 | 11/2011 | Boughorbel et al. | |
| 2012/0292502 A1 | 11/2012 | Langer et al. | |
| 2013/0035888 A1 | 2/2013 | Kandel | |
| 2013/0208279 A1 | 8/2013 | Smith | |
| 2013/0304424 A1 | 11/2013 | Bakeman et al. | |
| 2014/0019097 A1 | 1/2014 | Bakeman et al. | |
| 2014/0064445 A1 | 3/2014 | Adler | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0347666 A1 * | 11/2014 | Veldman | G01N 21/211 356/369 |
| 2015/0033201 A1 | 1/2015 | Vaid et al. | |
| 2015/0046121 A1 | 2/2015 | Dziura et al. | |
| 2015/0110249 A1 | 4/2015 | Bakeman et al. | |
| 2015/0117610 A1 | 4/2015 | Veldman et al. | |
| 2015/0204664 A1 | 7/2015 | Bringoltz et al. | |
| 2015/0285749 A1 | 10/2015 | Moncton et al. | |
| 2015/0300965 A1 | 10/2015 | Sezginer et al. | |
| 2016/0154319 A1 | 6/2016 | Mossavat et al. | |
| 2016/0202193 A1 | 7/2016 | Hench et al. | |
| 2016/0282105 A1 * | 9/2016 | Pandev | G01B 11/24 |
| 2016/0320319 A1 | 11/2016 | Hench et al. | |
| 2017/0167862 A1 | 6/2017 | Dziura et al. | |
| 2017/0287751 A1 * | 10/2017 | Kuznetsov | G03F 7/70633 |
| 2018/0106735 A1 | 4/2018 | Gellineau et al. | |
| 2018/0108578 A1 * | 4/2018 | Pandev | G01N 21/9503 |
| 2018/0113084 A1 | 4/2018 | Hench et al. | |
| 2018/0328868 A1 | 11/2018 | Bykanov et al. | |
| 2019/0017946 A1 | 1/2019 | Wack et al. | |
| 2019/0293578 A1 | 9/2019 | Gellineau | |

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

* cited by examiner

METHODS AND SYSTEMS FOR DETERMINING QUALITY OF SEMICONDUCTOR MEASUREMENTS

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and X-ray based metrology techniques offer the potential for high throughput without the risk of sample destruction. A number of metrology based techniques including scatterometry, reflectometry, and ellipsometry implementations and associated analysis algorithms are commonly used to characterize critical dimensions, film thicknesses, composition, overlay and other parameters of nanoscale structures.

Many metrology techniques are indirect methods of measuring physical properties of a specimen under measurement. In most cases, the raw measurement signals cannot be used to directly determine the physical properties of the specimen. Instead, a measurement model is employed to estimate the values of one or more parameters of interest based on the raw measurement signals. For example, ellipsometry is an indirect method of measuring physical properties of the specimen under measurement. In general, a physics-based measurement model or a machine learning based measurement model is required to determine the physical properties of the specimen based on the raw measurement signals (e.g., $\alpha_{meas}$ and $\beta_{meas}$).

In some examples, a physics-based measurement model is created that attempts to predict the raw measurement signals (e.g., $\alpha_{meas}$ and $\beta_{meas}$) based on assumed values of one or more model parameters. As illustrated in equations (1) and (2), the measurement model includes parameters associated with the metrology tool itself, e.g., machine parameters ($\beta_{machine}$), and parameters associated with the specimen under measurement. When solving for parameters of interest, some specimen parameters are treated as fixed valued ($P_{spec\text{-}fixed}$) and other specimen parameters of interest are floated ($P_{spec\text{-}float}$), i.e., resolved based on the raw measurement signals.

$$\alpha_{model} = f(P_{machine}, P_{spec\text{-}fixed}, P_{spec\text{-}float}) \quad (1)$$

$$\beta_{model} = g(P_{machine}, P_{spec\text{-}fixed}, P_{spec\text{-}float}) \quad (2)$$

Machine parameters are parameters used to characterize the metrology tool (e.g., ellipsometer 101). Exemplary machine parameters include angle of incidence (AOI), analyzer angle ($A_0$), polarizer angle ($P_0$), illumination wavelength, numerical aperture (NA), compensator or waveplate (if present), etc. Specimen parameters are parameters used to characterize the specimen (e.g., material and geometric parameters characterizing the structure(s) under measurement). For a thin film specimen, exemplary specimen parameters include refractive index, dielectric function tensor, nominal layer thickness of all layers, layer sequence, etc. For a CD specimen, exemplary specimen parameters include geometric parameter values associated with different layers, refractive indices associated with different layers, etc. For measurement purposes, the machine parameters and many of the specimen parameters are treated as known, fixed valued parameters. However, the values of one or more of the specimen parameters are treated as unknown, floating parameters of interest.

In some examples, the values of the floating parameters of interest are resolved by an iterative process (e.g., regression) that produces the best fit between theoretical predictions and experimental data. The values of the unknown, floating parameters of interest are varied and the model output values (e.g., $\alpha_{model}$ and $\beta_{model}$) are calculated and compared to the raw measurement data in an iterative manner until a set of specimen parameter values are determined that results in a sufficiently close match between the model output values and the experimentally measured values (e.g., $\alpha_{meas}$ and $\beta_{meas}$). In some other examples, the floating parameters are resolved by a search through a library of pre-computed solutions to find the closest match.

In some other examples, a trained machine learning based measurement model is employed to directly estimate values of parameters of interest based on raw measurement data. In these examples, a machine learning based measurement model takes raw measurement signals as model input and generates values of the parameters of interest as model output.

Both physics based measurement models and machine learning based measurement models must be trained to generate useful estimates of parameters of interest for a particular measurement application. Generally, model training is based on raw measurement signals collected from specimen having known values of the parameters of interest (i.e., Design of Experiments (DOE) data).

A machine learning based measurement model is parameterized by a number of weight parameters. Traditionally, the machine learning based measurement model is trained by a regression process (e.g., ordinary least squares regression). The values of the weight parameters are iteratively adjusted to minimize the differences between the known, reference values of the parameters of interest and values of the parameters of interest estimated by the machine learning based measurement model based on the measured raw measurement signals.

As described hereinbefore, a physics based measurement model is parameterized by a number of machine parameters and specimen parameters. Traditionally, a physics based measurement model is also trained by a regression process (e.g., ordinary least squares regression). One or more of the machine parameters and specimen parameters are iteratively adjusted to minimize the differences between the raw measurement data and the modelled measurement data. For each iteration, the values of the particular specimen parameters of interest are maintained at the known DOE values.

Both trained machine learning based measurement models and physics based models estimate values of parameters of interest based on measurement data. The accuracy of the estimation depends on measurement data. For example, measurement data outside the domain of the measurement data observed during the model training phase may give rise to large prediction errors due to extrapolation.

Traditionally, several techniques have been explored to quantify output uncertainty associated with each measurement site. These techniques include Bayesian regression (e.g., linear process regression, Gaussian process regression, etc.) using variational inference and Markov Chain Monte Carlo (MCMC) methods, Monte Carlo dropout as a Bayesian neural network, bootstrap sampling, output variation from different hyper parameter combinations, estimating the distance of the sample to the center of the training set, etc.

Unfortunately, these traditional techniques have met with limited practical success. Each of the aforementioned techniques represents an ensemble mean prediction that is not connected to the trained measurement model. The ensemble mean prediction is not the same as the prediction of an optimally trained measurement model. Thus, ensemble mean prediction fails to accurately estimate measurement uncertainty and fails to directly measure the quality of the measurement model. In addition, Bayesian regression and bootstrap sampling are computationally expensive and practically unsuitable for implementation as part of a high volume semiconductor fabrication facility. Finally, the aforementioned techniques are not normalized. Without normalization, the results cannot be consistently interpreted across different measurement recipes or structures under measurement.

Future metrology applications present challenges for metrology due to increasingly small resolution requirements, multi-parameter correlation, increasingly complex geometric structures, and increasing use of opaque materials. Thus, methods and systems for improved assessment of measurement quality are desired.

SUMMARY

Methods and systems for estimating a value of a quality metric indicative of one or more performance characteristics of a semiconductor measurement are presented herein. A quality metric is determined from a quality metric model trained based on actual measurement data, simulated measurement data, or both, and reference measurement data. Once trained, the quality metric model enables the calculation of a quantitative quality metric indicative of measurement quality for a particular measurement recipe based on measurement data collected from inline wafers at each measurement site without using reference metrology. The value of the quality metric is normalized to ensure applicability across a broad range of measurement scenarios.

In some embodiments, a value of a quality metric is determined for each measurement sample during measurement inference. In some embodiments, the trained measurement model is a defect classification model trained to detect and classify defects from measurement data.

In general, a quality metric may be employed for a variety of other purposes. A quality metric may be specifically employed to characterize the uncertainty associated with a measured parameter of interest, defect classification, etc. In some other examples, a quality metric is employed as a filter to detect measurement outliers. In some other examples, a quality metric is employed as a trigger to adjust a semiconductor process. Similarly, in some examples, quality metric values are employed to detect wafers that are not within manufacturing specifications. In some of these examples, quality metric values are employed to detect when a measurement tool bias has drifted out of specification. In other examples, quality metric values are employed to detect when a measurement error bias has drifted out of specification.

In one aspect, a quality metric model is trained by training parameters of a data reconstruction model. A data reconstruction model reconstructs each feature of a measurement data set based on the other features of the measurement data set and the values of the one or more parameters of interest estimated by a trained measurement model based on the measurement data set.

In another aspect, a trained quality metric model is employed to determine a value of a quality metric associated with a particular measurement based on the amount of measurement data.

In a further aspect, the raw quality metric value is normalized to broaden the applicability of the quality metric value to multiple recipes, tools, layers, use cases, etc. In this manner, the normalized quality metric is an index of measurement performance of a wide range of measurement scenarios.

In another aspect, the training data and measurement data employed to train and use a quality metric model as described herein is simulated, collected from actual measurements, or both, from multiple targets located in close proximity on a wafer. In some embodiments, the measurement targets under measurement as described herein may be actual device structures rather than a dedicated metrology target.

In another aspect, the training data and measurement data employed to train and use a quality metric model as described herein is collected from one or more targets by multiple, different metrology systems.

In some embodiments, the metrology systems employed to collect measurement data to estimate parameters of interest are different from the metrology systems employed to collect measurement data to estimate values of a quality metric.

In another further aspect, multiple, different parameters of interest are measured and corresponding quality metrics are evaluated for each different parameter of interest. In some embodiments, quality metrics associated with multiple, different parameters of interest are employed to more clearly identify the measurement uncertainty associated with a particular measurement recipe, more clearly identify when a change in process parameters is required, or both.

In another further aspect, values of parameters of interest, the corresponding quality metric values, or both, associated with structures in close proximity to a measurement target are employed to more clearly identify when a change in process parameters is required.

In yet another further aspect, the measurement results described herein can be used to provide active feedback to the process tool (e.g., lithography tool, etch tool, deposition tool, etc.).

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for estimating a value of a quality metric indicative of one or more performance characteristics of a semiconductor measurement are presented herein. A quality metric is determined from a quality metric model trained based on actual measurement data, simulated measurement data, or both, and reference measurement data. Once trained, the quality metric model enables the calculation of a quantitative quality metric indicative of measurement quality for a particular measurement recipe based on measurement data collected from inline wafers at each measurement site without using reference metrology. The value of the quality metric is normalized to ensure applicability across a broad range of measurement scenarios.

In general, the value of a quality metric is indicative of measurement uncertainty, abnormality of measurement data compared to training data, confidence of the values of parameters of interest estimated using the trained measurement model, need to adjust process variables at wafer level or wafer lot level, etc.

In some embodiments, a value of a quality metric is determined for each measurement sample during measurement inference. In some of these embodiments, a semiconductor measurement involves inferring values of one or more parameters of interest from measurement data using a trained measurement model. In some of these embodiments, the trained measurement model is physics-based. In some other embodiments, the trained measurement model is a machine learning based measurement model (e.g., linear model, neural network model, convolutional network model, etc.). If the estimated value of the quality metric indicates that measurement quality is insufficient, the measurement is flagged. In some examples, repeated instances of insufficient measurement quality indicate that the measurement model is outdated and requires re-training.

In some embodiments, the trained measurement model is a defect classification model trained to detect and classify defects from measurement data. In these embodiments, a trained quality metric model is employed to determine the uncertainty of the defect classification. In some of these embodiments, the measurement data is image data, and the trained quality metric model is employed to determine the uncertainty of the defect detection from the image data.

In some embodiments, the trained measurement model is a metrology model trained to estimate values of geometric parameters of interest (e.g., critical dimensions, overlay, etc.), dispersion parameters of interest (e.g., index of refraction, etc.), process parameters of interest (e.g., lithographic focus, dosage, etc.), electrical properties of interest (e.g., bandgap, etc.), or any combination thereof. In these embodiments, a trained quality metric model is employed to determine the uncertainty of the estimated parameters of interest.

A quality metric may be specifically employed to characterize the uncertainty associated with a measured parameter of interest, defect classification, etc. However, in general, a quality metric may be employed for a variety of other purposes. In some examples, a quality metric is employed as a filter to detect measurement outliers. In one example, the value of a quality metric associated with a particular measurement is compared to a predetermined threshold value. If the quality metric value exceeds the predetermined threshold value, the measurement is considered an outlier. In some examples, a quality metric is employed as a trigger to adjust a semiconductor process. For example, if the average value of a number of quality metrics each associated with a different instance of the same measurement exceeds a predetermined threshold value, the process is adjusted to bring the average value of the quality metric back into a desired range.

Similarly, in some examples, quality metric values are employed to detect wafers that are not within manufacturing specifications. In some of these examples, quality metric values are employed to detect when a measurement tool bias has drifted out of specification. In other examples, quality metric values are employed to detect when a measurement error bias has drifted out of specification.

Figure 1:
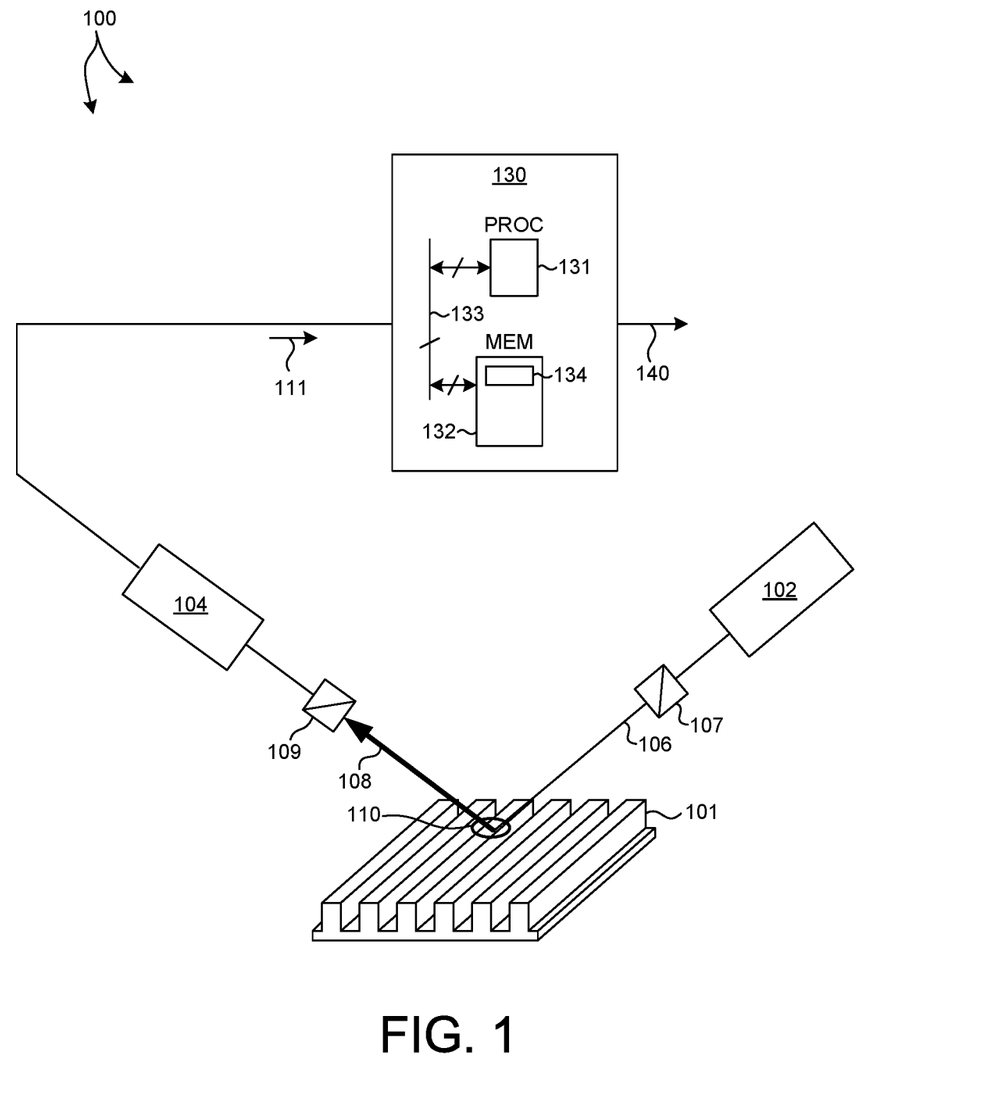
FIG. 1 depicts an illustration of a wafer metrology system 100 for monitoring the measurement quality of measurements performed on a wafer in accordance with the exemplary methods presented herein.

FIG. 1 illustrates a system 100 for measuring characteristics of a specimen and evaluating a quality metric associated with each measurement in accordance with the exemplary methods presented herein. As shown in FIG. 1, the system 100 may be used to perform spectroscopic ellipsometry measurements of structure 101. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 100-2500 nm) to the surface of the specimen upon which structure 101 is fabricated. In turn, the spectrometer 104 is configured to receive illumination reflected from structure 101. It is further noted that the light emerging from the illuminator 102 is polarized using a polarization state generator 107 to produce a polarized illumination beam 106. The radiation reflected by structure 101 is passed through a polarization state analyzer 109 and to the spectrometer 104. The radiation received by the spectrometer 104 in the collection beam 108 is analyzed with regard to polarization state, allowing for spectral analysis by the spectrometer of radiation passed by the analyzer. These spectra 111 are passed to the computing system 130 for analysis of the structure as described herein.

As depicted in FIG. 1, system 100 includes a single measurement technology (i.e., SE). However, in general, system 100 may include any number of different measurement technologies. By way of non-limiting example, system 100 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, a single tool integrating multiple technologies, or a combination thereof.

In a further embodiment, system 100 may include one or more computing systems 130 employed to perform measurements of structures and determine quality metric values in accordance with the methods described herein. The one or more computing systems 130 may be communicatively coupled to the spectrometer 104. In one aspect, the one or more computing systems 130 are configured to receive measurement data 111 associated with measurements of a structure under measurement (e.g., structure 101).

Figure 2:
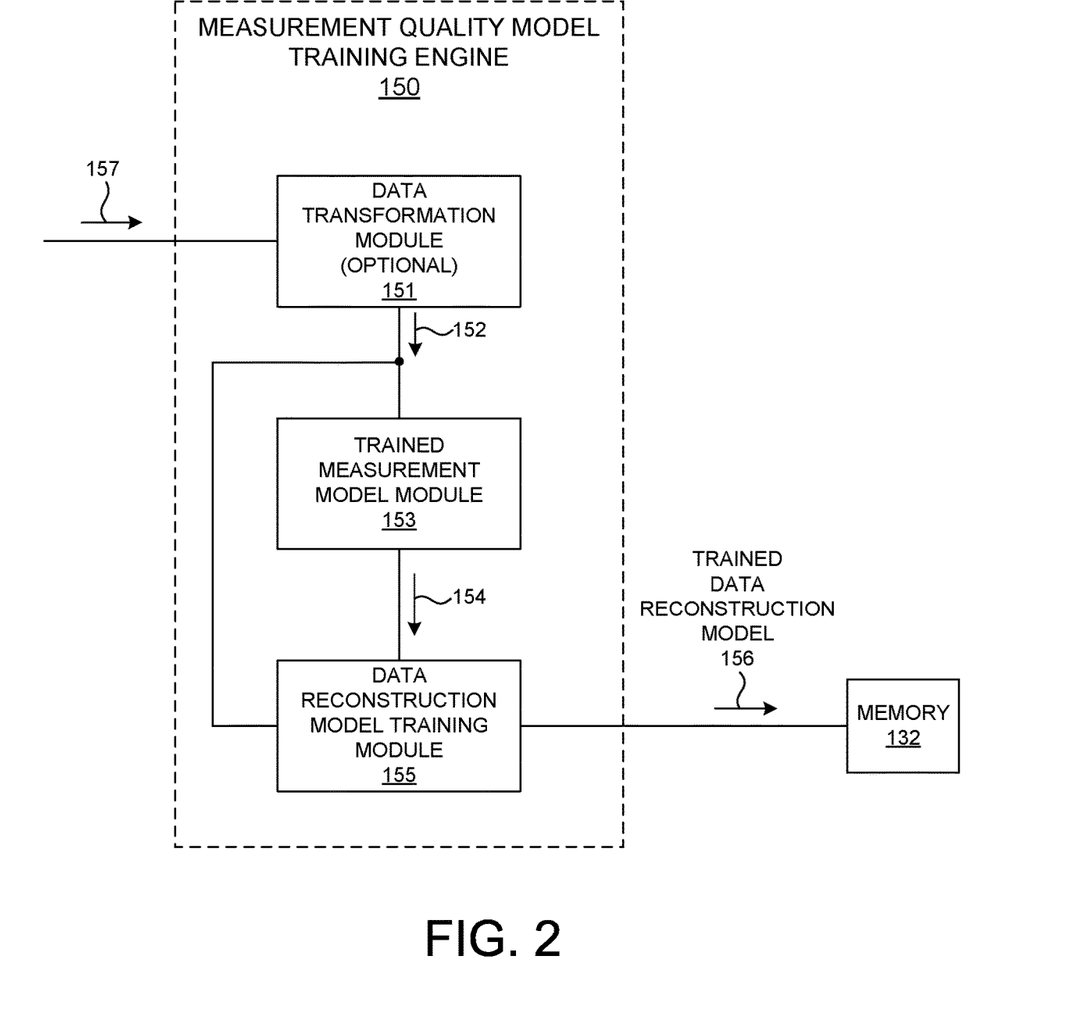
FIG. 2 is a diagram illustrative of an exemplary measurement quality model training engine 150 in one embodiment.

In one aspect, computing system 130 is configured as a measurement quality model training engine to train a quality metric model associated with measurements of structures under measurement. FIG. 2 is a diagram illustrative of an exemplary measurement quality model training engine 150 in one embodiment. As depicted in FIG. 2, measurement quality model training engine 150 includes an optional data transformation module 151, a trained measurement model module 153, and a data reconstruction model training module 155.

A quality metric model is trained based on an amount of training data and reference data. Training data includes actual measurement data, simulated measurement data, or both. In some embodiments, training data includes simulated measurement data from the simulation of a measurement of particular target by a particular measurement tool. In some embodiments, training data includes actual measurement data from the measurement of particular target by a particular measurement tool. In some of these embodiments, the measurement data includes actual measurements of targets on nominal wafers. In some of these embodiments, the measurement data includes actual measurements of targets on Design Of Experiments (DOE) wafers having known, programmed values of parameters of interest.

Training data may be simulated, collected, or both, for any of a variety of measurement objectives. In some embodiments the measurement objective is measurement accuracy, measurement precision tracking, tool-to-tool matching, wafer-to-wafer variation, etc.

As described hereinbefore, training data is required to train a measurement model. The training data employed to train the quality metric model may be the same training data set employed to train the corresponding measurement model, a subset of the training data set employed to train the corresponding measurement model, or a data set different from the training data set employed to train the corresponding measurement model. In a preferred embodiment, the training data employed to train the quality metric model is the same data set or a subset of the data set employed to train the corresponding measurement model.

The reference data employed to train a quality metric model includes trusted values of the one or more parameters of interest associated with the measurement. In some embodiments, the reference data is obtained from a reference metrology system, i.e., a metrology system trusted to provide a suitable measurement of the parameter of interest. In some embodiments, the reference data is provided by a user of the measurement system based on experience. In some embodiments, the reference data is provided as the known, programmed values of the parameters of interest associated with the measured DOE wafers. In some embodiments, the reference data is derived from a statistical analysis of measurements of the parameters of interest by multiple, different measurement techniques. In some embodiments, the reference data is derived from known physical constraints.

In general, the reference data expresses the values of one or more parameters of interest in various terms such as precision, accuracy (e.g., bias), tracking (e.g., correlation to reference), tool-to-tool matching, within wafer variation, wafer mean, wafer signature, wafer to wafer variations, etc.

In some embodiments, features of the training data set are directly employed as input data to train the quality metric model. However, in some other embodiments, the training data set is transformed to a reduced dimension and the features of the reduced training data set are directly employed to train the quality metric model. In many practical situations it is preferred to reduce the dimension of the training data set to reduce the computational burden. In one example, a set of measured spectra employed as training data may include thousands of features (e.g., 15,000 measured signals). However, using data reduction, the dimension of the training data set may be reduced by one or more orders of magnitude (e.g., 200 signals).

In some embodiments, data feature dimension reduction is achieved by principle component analysis, where the measured data set is resolved into a much smaller set of principle components. In general, any suitable data reduction technique may be employed, e.g., Fourier analysis, wavelet analysis, discrete cosine transform analysis, etc.

As depicted in FIG. 2, training data set 157 is received by data transformation module 151. In one example, data transformation module 151 transforms the features of the training data set 157 to a set of principal components 152 having n components as depicted in Equation (1), where $PC^T$ is the vector of principle components of the training data set 152 communicated to trained measurement model module 153 and data reconstruction model training module 155.

$$PC^T = [PC_1^T, PC_2^T, \ldots, PC_N^T] \tag{1}$$

In one aspect, a quality metric model is trained by training parameters of a data reconstruction model. A data reconstruction model reconstructs each feature of a measurement data set based on the other features of the measurement data set and the values of the one or more parameters of interest estimated by a trained measurement model based on the measurement data set.

In one example, a data reconstruction model is illustrated in Equation (2), where, $PC_i$ is the $i^{th}$ feature of the measurement data set, $PC_i^*$, is the reconstructed value of $PC_i$, y is the measured parameter(s) of interest, $g_i$, is the reconstruction function associated with the $i^{th}$ feature of the measurement data set, and $P_i$ are reconstruction model constants associated with the $i^{th}$ reconstruction function.

$$PC_1^* = g_1(PC_2, PC_3, \ldots, PC_n, y, y^2, y^3, y^4, P_1)]) \tag{2}$$
$$PC_2^* = g_2(PC_1, PC_3, \ldots, PC_n, y, y^2, y^3, y^4, P_2)])$$
$$\ldots$$
$$PC_n^* = g_n(PC_1, PC_2, \ldots, PC_{n-1}, y, y^2, y^3, y^4, P_n)])$$

In the example illustrated in Equation (2), each feature of the measurement data set is a principle component. In general, the reconstruction function, g, may be any suitable parameterized model, e.g., a linear model, a neural network model, etc. In the example illustrated in Equation (2), each principal component reconstruction is a function of the measured parameter of interest up to a 4th order polynomial basis, principal components of the measurement data set except for the principal component being reconstructed, and the constant parameters of each reconstruction function, g.

The data reconstruction model is trained based on the training data set (with or without data reduction) and the values of the parameters of interest, y, either known from reference measurements or calculated from the training data set using the trained measurement model. The training results in a tuned set of model parameters, e.g., $P_i$. As depicted in FIG. 2, the trained data reconstruction model 156 is stored in memory 132.

As depicted in FIG. 2, the set of principal components 152 is communicated to trained measurement model module 153. The trained measurement model module 153 determines values of one or more parameters of interest, y, based on the set of principle components 152 using the trained measurement model. The calculated values of the parameters of interest 154 are communicated to the data reconstruction model training module 155. In this example, the values of the parameters of interest, y, are calculated from the training data set using the trained measurement model. In an alternative example, the values of the parameters of interest 154 are communicated directly to the data reconstruction model training module 155.

In some embodiments, the data reconstruction model is trained by minimizing the sum of the differences between each feature of the training data set and each corresponding reconstructed feature; typically expressed as a least squares minimization. Equation (3) illustrates a data reconstruction model training by way of non-limiting example.

$$\min \sum_{i=1}^{n} (PC_i^T - PC_i^*) = \min \sum_{i=1}^{n} (PC_i^T - g_i(PC_1, PC_3, \ldots, PC_{i-1}, PC_{i+1}, \ldots PC_n, y, y^2, y^3, y^4, P_i)]) \quad (3)$$

In some other embodiments, the data reconstruction model is trained based on specific domain knowledge associated with the training data. Domain knowledge is expressed as one or more probability distributions, which are, in turn, employed to regularize the optimization process employed during training. In this manner, the optimization process is physically regularized by one or more expressions of the physically based probability distributions. By way of non-limiting example, probability distributions associated with measurement precision, tool to tool matching, tracking, within wafer variations, etc. are employed to physically regularize the optimization process. In this manner, domain knowledge acquired from experience, measurement data, and physics is directly expressed in the objective function driving the optimization of the data reconstruction model. As a result, domain knowledge is fully exploited in the quality metric model development process.

In another aspect, a trained quality metric model is employed to determine a value of a quality metric associated with a particular measurement based on the amount of measurement data.

The measurement data includes actual measurement data, simulated measurement data, or both. In some embodiments, measurement data includes simulated measurement data from the simulation of a measurement of one or more measurement targets that are structurally different from measurement targets employed as part of the training data set.

In some embodiments, measurement data includes actual measurement data from the measurement of particular targets by a particular measurement tool. Typically, the measurement data includes actual measurements of targets on nominal wafers. In some embodiments, measurement data is collected from multiple wafers to estimate wafer to wafer variation. In some embodiments, measurement data is collected from DOE wafer to estimate measurement accuracy, precision tracking, or both. In some embodiments, measurement data is collected by multiple measurement systems to estimate tool to tool matching.

In some embodiments, features of the measurement data set are directly employed as input data to the trained quality metric model. However, in some other embodiments, the measurement data set is transformed to a reduced dimension and the features of the reduced measurement data set are directly employed as input data to the trained quality metric model. In many practical situations it is preferred to reduce the dimension of the measurement data set to reduce the computational burden. In general, the same data feature dimension reduction technique employed to reduce the training data set is also employed to reduce the measurement data set.

In some embodiments, data feature dimension reduction is achieved by principle component analysis, where the measured data set is resolved into a much smaller set of principle components. In general, any suitable data reduction technique may be employed, e.g., Fourier analysis, wavelet analysis, discrete cosine transform analysis, etc.

Figure 3:
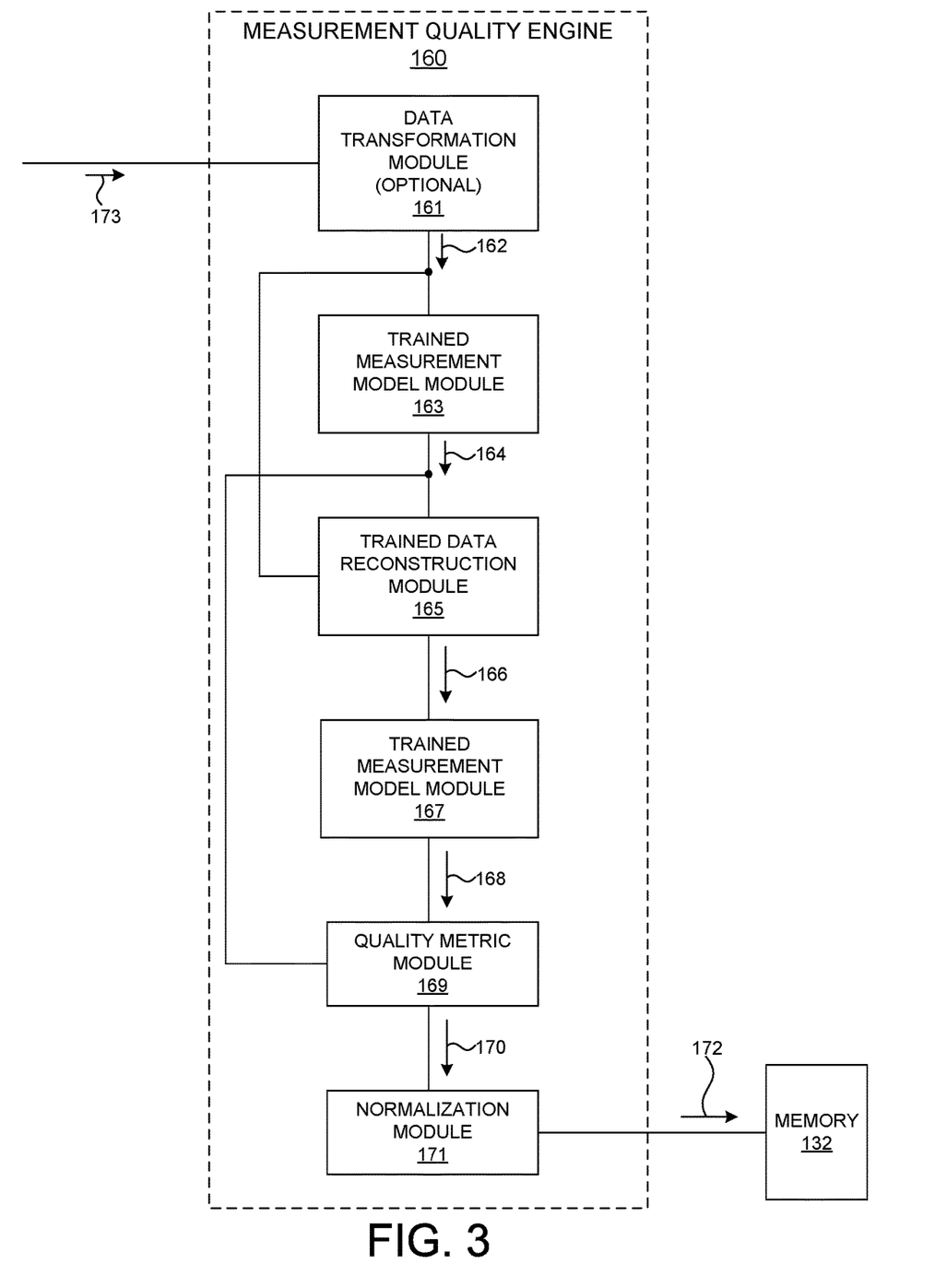
FIG. 3 is a diagram illustrative of an exemplary measurement quality engine 160 in another embodiment.

As depicted in FIG. 3, measurement data set 173 is received by data transformation module 161. In one example, data transformation module 161 transforms the features of the training data set 173 to a set of principal components 162 having n components as depicted in Equation (4), where PC is the vector of principle components of the measurement data set 162 communicated to trained measurement model module 163 and trained data reconstruction module 165.

$$PC = [PC_1, PC_2, \ldots, PC_n] \quad (4)$$

As depicted in FIG. 3, the set of principal components 162 is communicated to trained measurement model module 163. The trained measurement model module 163 determines values of one or more parameters of interest, y, based on the set of principle components 162 using the trained measurement model. The calculated values of the parameters of interest 164 are communicated to the trained data reconstruction module 165. Exemplary parameters of interest include geometric parameters, dispersion parameters, process parameters or electrical parameters characterizing the measured structure.

Alternatively, the measurement data set 173 is processed by the trained measurement model to estimate values of one or more parameters of interest characterizing the measured structure, e.g., y.

The data reconstruction model reconstructs each feature of the measurement data set (or reduced measurement data set) based on the other features of the measurement data set and the values of the one or more parameters of interest estimated by the trained measurement model based on the measurement data set. In one example, a data reconstruction model is illustrated in Equation (2). In this example, $PC_i$ is the $i^{th}$ feature of the measurement data set, $PC_i^*$, is the reconstructed value of $PC_i$, y is the measured parameter(s)

of interest, $g_i$, is the reconstruction function associated with the $i^{th}$ feature of the measurement data set, and $P_i$ is the vector of reconstruction model constants associated with the $i^{th}$ reconstruction function.

As depicted in FIG. 3, the set of principle components 162 and the calculated values of the parameters of interest 164 are communicated to the trained data reconstruction module 165. The reconstruction functions and reconstruction model constants are known. The trained data reconstruction module 165 determines the values of the reconstructed measurement data set, e.g., reconstructed principle components 166, using the trained data reconstruction model as illustrated in Equation (2) by way of non-limiting example.

In general, if the measurement data under evaluation is close to the training space, each data feature, e.g., $PC_i$, will be similar to its corresponding reconstructed data feature, e.g., $PC_i^*$.

As depicted in FIG. 3, the trained measurement model module 167 receives the reconstructed measurement data set 166 and estimates values of the one or more parameters of interest 168 characterizing the measured structure, e.g., $y^*$, using the trained measurement model.

As depicted in FIG. 3, the quality metric module 169 receives the values of the one or more parameters of interest 168 determined based on the reconstructed measurement data set and the one or more parameters of interest 164 determined based on the measurement data set. A raw quality metric value 170 is determined as an absolute difference between the measured value of the parameter of interest, e.g., y, and the value of the parameter of interest estimated using the reconstructed measurement data, e.g., $y^*$, as illustrated by Equation (5), where $QM_{raw}$ is the value of the raw quality metric. The difference indicates the uncertainty in the value of the parameter of interest estimated using the measurement model.

$$QM_{raw}=|y-y^*| \tag{5}$$

As depicted in FIG. 3, the normalization module 171 normalizes the raw quality metric value 170 to generate a normalized quality metric value 172 stored in memory 132. The scale of the raw quality metric value varies depending on layer, tool, measurement recipe, use case, etc. In a further aspect, the raw quality metric value is normalized to broaden the applicability of the quality metric value to multiple recipes, tools, layers, use cases, etc. In this manner, the normalized quality metric is an index of measurement performance of a wide range of measurement scenarios.

In some examples, the normalized quality metric value is bounded from zero to one. In this manner, the normalized quality metric value is standardized and consistent. Smaller values indicate a high confidence measurement, and vice-versa.

In some embodiments, normalization of a raw quality metric value is achieved in an iterative manner. First, a normalized quality metric value is determined based on the raw quality metric value and an initial value of a normalization factor, $\alpha^0$. By way of non-limiting example, Equation (6) illustrates a first iteration of the normalization of a raw quality metric value, where $QM_{norm}$ is the normalized quality metric value, $QM_{raw}$ is the raw quality metric value, $\alpha^0$ is the initial value of the normalization factor, $\alpha$, and $QM_{critical}$ is the 95% quantile value of the distribution of values of the raw quality metric value, $QM_{raw}$. As illustrated in Equation (6), the value of $QM_{norm}$ is bounded by the values zero and one.

$$QM_{norm} = \min\left(\frac{QM_{raw}}{(\alpha^0)QM_{critical}}, 1.0\right) \tag{6}$$

Second, the normalization factor, $\alpha$, is updated based on the distribution of the normalized quality metric value and the initial value of the normalization factor, $\alpha^0$.

By way of non-limiting example, Equation (7) illustrates an update of the value of the normalization factor, where $\alpha$ is the updated value of the normalization factor, $\alpha^0$ is the initial value of the normalization factor, $\alpha$, threshold is a constant value, e.g. 0.8, and $QM_{norm-98\%}$ is the 98% quantile value of the distribution of values of the normalized quality metric value, $QM_{norm}$.

$$\alpha = \frac{QM_{norm-98\%}}{threshold}\alpha^0 \tag{7}$$

Third, the normalized quality metric value is determined based on the raw quality metric value and the updated value of normalization factor, $\alpha$. By way of non-limiting example, Equation (8) illustrates a second iteration of the normalization of the raw quality metric value, where $QM_{norm}$ is the normalized quality metric value, $QM_{raw}$ is the raw quality metric value, $\alpha$ is the updated value of the normalization factor, and $QM_{critical}$ is the 95% quantile value of the distribution of values of the raw quality metric value, $QM_{raw}$. As illustrated in Equation (8), the value of $QM_{norm}$ is bounded by the values zero and one.

$$QM_{norm} = \min\left(\frac{QM_{raw}}{(\alpha)QM_{critical}}, 1.0\right) \tag{8}$$

FIGS. 4A-4F are plots illustrative of the correlation between the absolute errors in the values of a parameter of interest determined by a measurement model and the corresponding quality metric values associated with each measurement.

In these examples, the absolute error, $Error_{abs}$, in the measured value of the parameter of interest is determined as the absolute difference between the known, reference value of the parameter of interest, $y_{ref}$ and the value of the parameter of interest, y, estimated by the measurement model from each simulated measurement spectrum.

$$Error_{abs}=|y-y_{ref}| \tag{9}$$

The raw quality metric values, $QM_{raw}$, associated with each measurement are determined as an absolute difference between the measured value of the parameter of interest, e.g., y, and the value of the parameter of interest estimated using reconstructed measurement data, e.g., $y^*$, as illustrated by Equation (10).

$$QM_{raw}=|y-y^*| \tag{10}$$

Each of FIGS. 4A-4F illustrates the correlation between absolute error and the corresponding quality metric value for different values of focus, different process conditions and different measurement conditions.

Figure 4A:
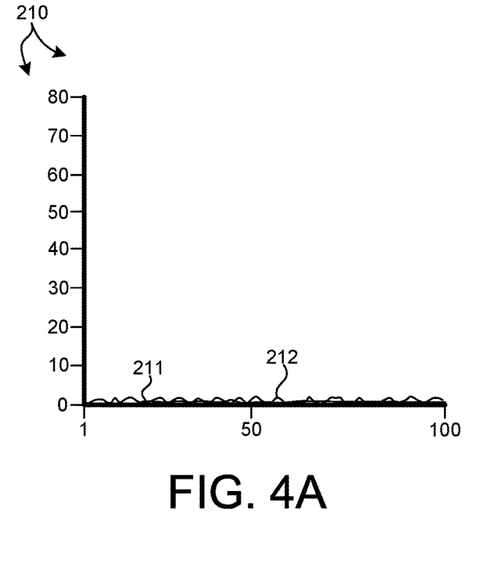
FIGS. 4A-4F are plots illustrative of the correlation between the absolute errors in the values of a parameter of interest determined by a measurement model and the corresponding quality metric values associated with each measurement.

FIG. 4A illustrates a plot 210 illustrative of the correlation between absolute error and the corresponding quality metric value for one hundred different measurements including a range of variation in under-layer thickness of 5% and a range of focus values within the training data set employed to train the measurement model and the quality metric model. As illustrated in FIG. 4A, plotline 211 illustrates the absolute errors and plotline 212 illustrates the corresponding quality metric values. As illustrated in FIG. 4A, the absolute errors are quite low, as are the corresponding values of the quality metric for all test conditions. The machine learning based measurement model and the quality metric model are both trained based on training data similar to the measurements depicted in FIG. 4A, thus the small values of absolute error and corresponding quality metric values illustrate that the quality metric methodology described herein is effective within the domain of the training data.

Figure 4B:
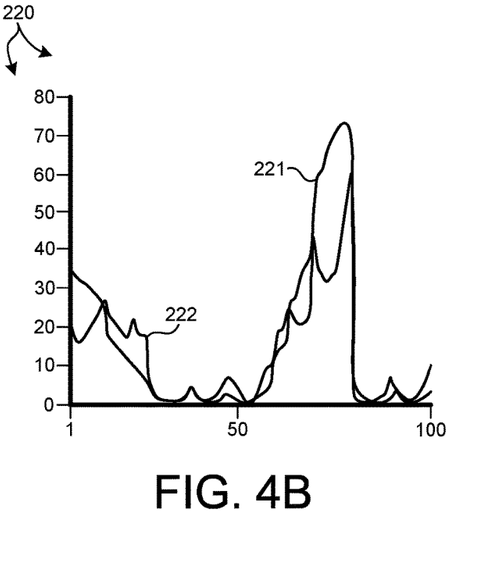

FIG. 4B illustrates a plot 220 illustrative of the correlation between absolute error and the corresponding quality metric value for one hundred different measurements including a range of variation in under-layer thickness of 10% and a range of focus values within and outside the training data set employed to train the measurement model and the quality metric model. As illustrated in FIG. 4B, plotline 221 illustrates the absolute errors and plotline 222 illustrates the corresponding quality metric values. As illustrated in FIG. 4B, the absolute errors vary depending on test conditions as well as the corresponding values of the quality metric. In addition, the quality metric values correlate well with absolute error for all test conditions.

Figure 4C:
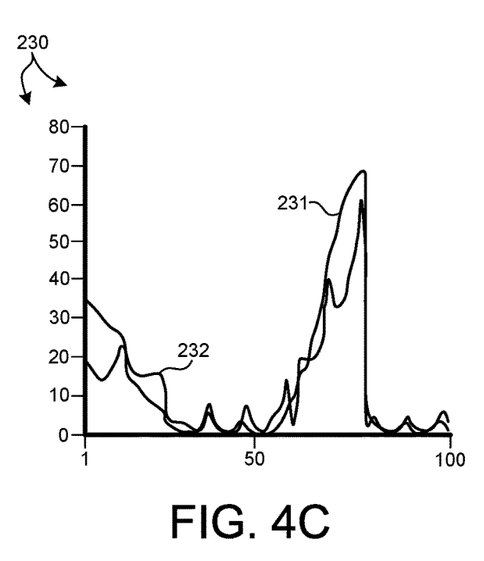

FIG. 4C illustrates a plot 230 illustrative of the correlation between absolute error and the corresponding quality metric value for one hundred different measurements including a range of variation in under-layer thickness of 5%, a mean shift of one layer by 10%, and a range of focus values within and outside the training data set employed to train the measurement model and the quality metric model. As illustrated in FIG. 4C, plotline 231 illustrates the absolute errors and plotline 232 illustrates the corresponding quality metric values. As illustrated in FIG. 4C, the absolute errors vary depending on test conditions as well as the corresponding values of the quality metric. Again, the quality metric values correlate well with absolute error for all test conditions.

Figure 4D:
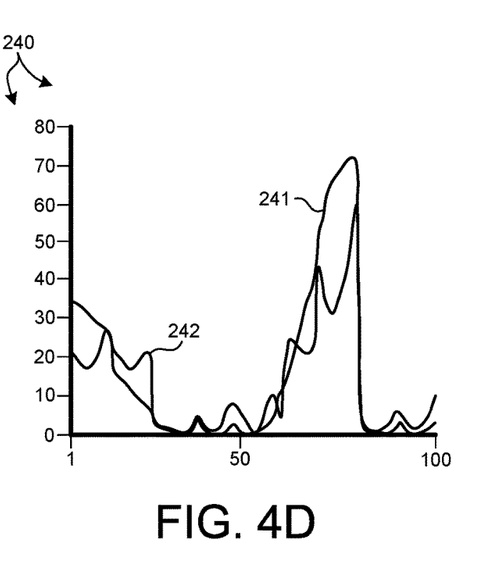

FIG. 4D illustrates a plot 240 illustrative of the correlation between absolute error and the corresponding quality metric value for one hundred different measurements including a range of variation in under-layer thickness of 5%, and a range of focus values within and outside the training data set employed to train the measurement model and the quality metric model. As illustrated in FIG. 4D, plotline 241 illustrates the absolute errors and plotline 242 illustrates the corresponding quality metric values. As illustrated in FIG. 4D, the absolute errors vary depending on test conditions as well as the corresponding values of the quality metric. Again, the quality metric values correlate well with absolute error for all test conditions.

Figure 4E:
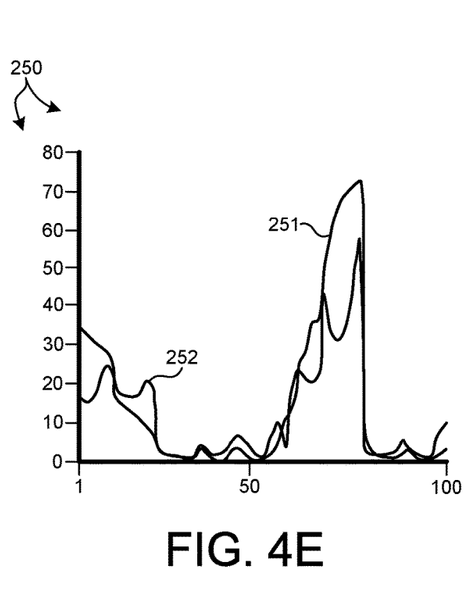

FIG. 4E illustrates a plot 250 illustrative of the correlation between absolute error and the corresponding quality metric value for one hundred different measurements including a range of variation in under-layer thickness of 5%, a shift of angle of incidence of 0.1 degrees, and a range of focus values within and outside the training data set employed to train the measurement model and the quality metric model. As illustrated in FIG. 4E, plotline 251 illustrates the absolute errors and plotline 252 illustrates the corresponding quality metric values. As illustrated in FIG. 4E, the absolute errors vary depending on test conditions as well as the corresponding values of the quality metric. Again, the quality metric values correlate well with absolute error for all test conditions.

Figure 4F:
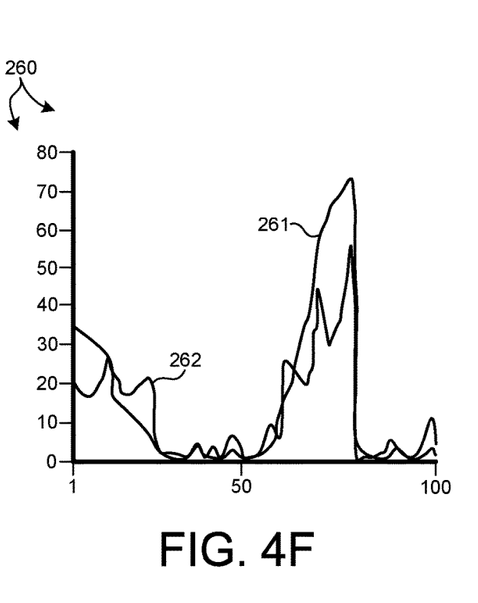

FIG. 4F illustrates a plot 260 illustrative of the correlation between absolute error and the corresponding quality metric value for one hundred different measurements including a range of variation in under-layer thickness of 5%, a three-fold increase in measurement system noise, and a range of focus values within and outside the training data set employed to train the measurement model and the quality metric model. As illustrated in FIG. 4F, plotline 261 illustrates the absolute errors and plotline 262 illustrates the corresponding quality metric values. As illustrated in FIG. 4F, the absolute errors vary depending on test conditions as well as the corresponding values of the quality metric. Again, the quality metric values correlate well with absolute error for all test conditions.

The machine learning based measurement model and the quality metric model are both trained based on training data having a domain that is smaller than the measurements depicted in FIGS. 4B-4F. Regardless, the values of absolute error and corresponding quality metric values are well correlated. This illustrates that the quality metric methodology described herein is effective outside the domain of the training data. Thus, the quality metric methodology described herein can be used to detect the uncertainty in measured values of parameters of interest.

Figure 5:
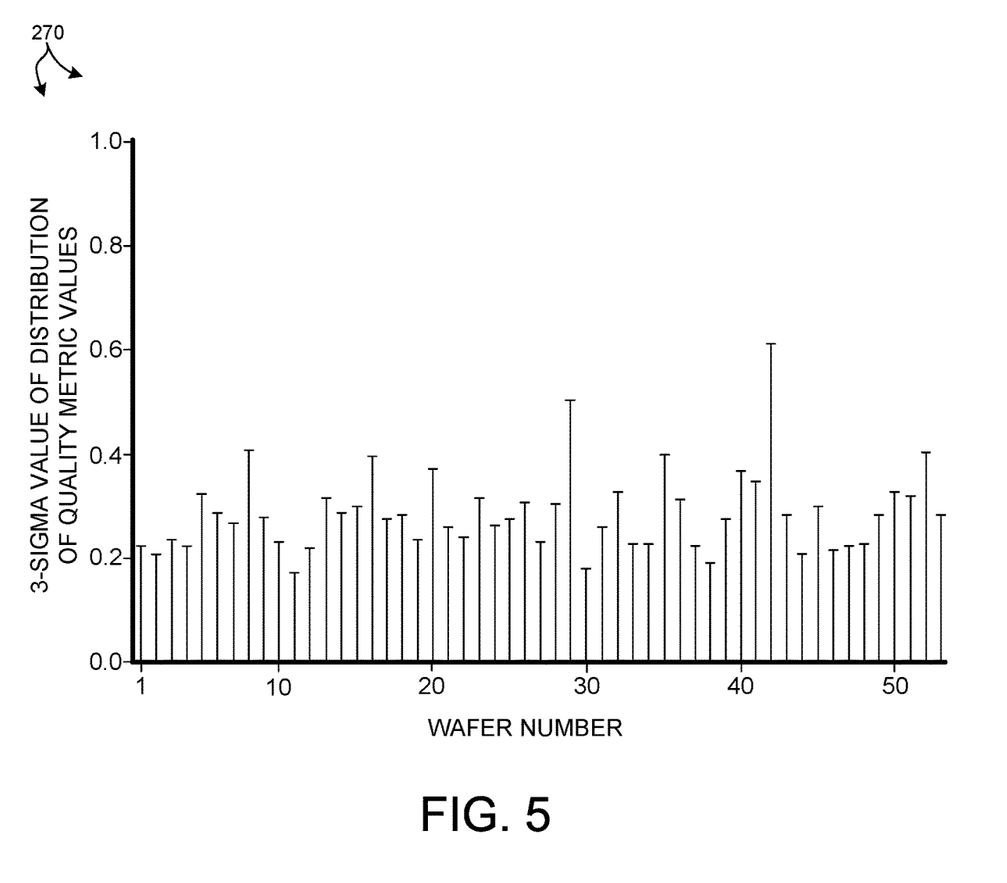
FIG. 5 is a plot indicative of the distribution of quality metric values calculated for a number of measurement sites on each of a number of wafers.

FIG. 5 is a plot 270 indicative of the distribution of quality metric values calculated for a number of measurement sites on each of a number of wafers. As depicted in FIG. 5, each vertical bar represents the 3-sigma value of the distribution of quality metric values calculated for a large number of measurement sites on each particular wafer. As depicted in FIG. 5, the 3-sigma values of each distribution are quite small, indicating relatively tight distributions. As a result, any measurements having a relatively large value quality metric, e.g., greater than 0.8, are likely to be outliers.

In another aspect, the training data and measurement data employed to train and use a quality metric model as described herein is simulated, collected, or both, from multiple targets located in close proximity on a wafer.

In some embodiments, the measurement targets under measurement as described herein may be actual device structures rather than a dedicated metrology target.

In another aspect, the training data and measurement data employed to train and use a quality metric model as described herein is collected from one or more targets by multiple, different metrology systems. In one example, measurement data from a first target may be collected by a spectroscopic ellipsometer, measurement data from the same target, or a different target may be collected by a small-angle x-ray scatterometry (SAXS) system, and measurement data from the same target or a different target may be collected by an imaging based metrology system.

In some embodiments, the metrology systems employed to collect measurement data to estimate parameters of interest are different from the metrology systems employed to collect measurement data to estimate values of a quality metric.

In another further aspect, multiple, different parameters of interest are measured and corresponding quality metrics are evaluated for each different parameter of interest. In some embodiments, quality metrics associated with multiple, different parameters of interest are employed to more clearly identify the measurement uncertainty associated with a particular measurement recipe, more clearly identify when a change in process parameters is required, or both.

In another further aspect, values of parameters of interest, the corresponding quality metric values, or both, associated with structures in close proximity to a measurement target are employed to more clearly identify when a change in process parameters is required.

In general, the training data and measurement data employed to train and use a quality metric model as described herein may be collected from any suitable semiconductor measurement system. Suitable systems, by way of non-limiting example, include a spectroscopic ellipsometer, a spectroscopic reflectometer, a soft x-ray based metrology system, a small angle x-ray scatterometry system, an imaging system, a hyperspectral imaging system, etc.

In yet another further aspect, the measurement results described herein can be used to provide active feedback to the process tool (e.g., lithography tool, etch tool, deposition tool, etc.). For example, values of measured parameters determined based on measurement methods described herein can be communicated to an etch tool to adjust the etch time to achieve a desired etch depth. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values may be communicated to the process tool. In one embodiment, computing system 130 determines values of one or more parameters of interest. In addition, computing system 130 communicates control commands to a process controller based on the determined values of the one or more parameters of interest. The control commands cause the process controller to change the state of the process (e.g., stop the etch process, change the diffusivity, etc.). In one example, a control command causes a process controller to adjust the focus of a lithographic system, a dosage of the lithographic system, or both. In another example, a control command causes a process controller to change the etch rate to improve measured wafer uniformity of a CD parameter.

In some examples, the measurement models are implemented as an element of a SpectraShape® optical critical-dimension metrology system available from KLA-Tencor Corporation, Milpitas, Calif., USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

Figure 6:
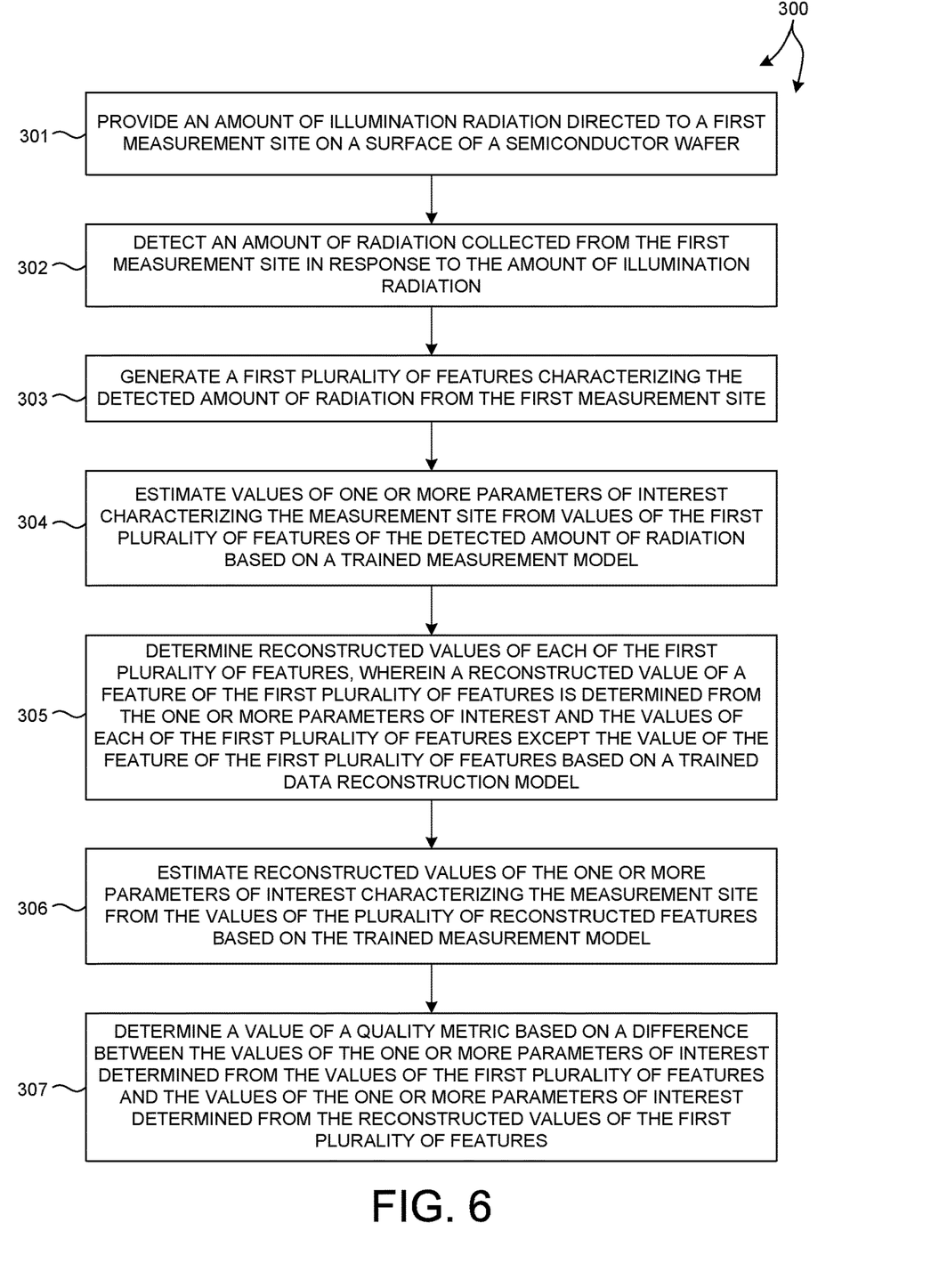
FIG. 6 illustrates a flowchart of a method 300 for estimating values of a quality metric indicative of one or more performance characteristics of a semiconductor measurement.

FIG. 6 illustrates a method 300 for estimating a value of a quality metric indicative of one or more performance characteristics of a semiconductor measurement in at least one novel aspect. Method 300 is suitable for implementation by a metrology system such as metrology system 100 illustrated in FIG. 1 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 301, an amount of illumination radiation is directed to a first measurement site on a surface of a semiconductor wafer.

In block 302, an amount of radiation collected from the first measurement site in response to the amount of illumination radiation is detected.

In block 303, a first plurality of features characterizing the detected amount of radiation from the first measurement site is generated.

In block 304, values of one or more parameters of interest are estimated. The one or more parameters characterize the measurement site from values of the first plurality of features of the detected amount of radiation based on a trained measurement model.

In block 305, reconstructed values of each of the first plurality of features are determined. A reconstructed value of a feature of the first plurality of features is determined from the one or more parameters of interest based on a trained data reconstruction model and the values of each of the first plurality of features except the value of the feature.

In block 306, reconstructed values of the one or more parameters of interest characterizing the measurement site are estimated from the values of the plurality of reconstructed features based on the trained measurement model.

In block 307, a value of a quality metric is determined based on a difference between the values of the one or more parameters of interest determined from the values of the first plurality of features and the values of the one or more parameters of interest determined from the reconstructed values of the first plurality of features.

In a further embodiment, system 100 includes one or more computing systems 130 employed to perform measurements of semiconductor structures based on spectroscopic measurement data collected in accordance with the methods described herein. The one or more computing systems 130 may be communicatively coupled to one or more spectrometers, active optical elements, process controllers, etc. In one aspect, the one or more computing systems 130 are configured to receive measurement data associated with spectral measurements of structures of wafer 104.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:
a metrology subsystem comprising:
an illumination source configured to provide an amount of illumination radiation directed to a first measurement site on a surface of a semiconductor wafer;
a detector configured to detect an amount of radiation collected from the first measurement site in response to the amount of illumination radiation; and
a computing system configured to:
generate values of a first plurality of features characterizing the detected amount of radiation from the first measurement site;
estimate values of one or more parameters of interest characterizing the first measurement site from the generated values of the first plurality of features of the detected amount of radiation based on a trained measurement model;
determine reconstructed values of each of the first plurality of features, wherein a reconstructed value of a feature of the first plurality of features is determined from the estimated values of the one or more parameters of interest and the generated values of each of the first plurality of features except the generated value of the feature of the first plurality of features based on a trained data reconstruction model;
estimate reconstructed values of the one or more parameters of interest characterizing the first measurement site from the reconstructed values of the first plurality of features based on the trained measurement model; and
determine a value of a quality metric based on a difference between the estimated values of the one or more parameters of interest determined from the generated values of the first plurality of features and the reconstructed values of the one or more parameters of interest determined from the reconstructed values of the first plurality of features.

2. The system of claim 1, wherein the computing system is further configured to normalize the value of the quality metric.

3. The system of claim 1, the computing system further configured to:
train one or more parameters of the data reconstruction model by minimizing a difference between values of a second plurality of features of a measurement of a second measurement site different from the first measurement site and reconstructed values of the second plurality of features, wherein a reconstructed value of a feature of the second plurality of features is determined from values of the one or more parameters of interest characterizing the second measurement site and the values of the second plurality of features except the feature.

4. The system of claim 3, wherein the second plurality of features of the measurement of the second site are simulated.

5. The system of claim 3, wherein the values of the one or more parameters of interest characterizing the second measurement site are estimated from values of the second plurality of features based on the trained measurement model.

6. The system of claim 3, wherein the values of the one or more parameters of interest characterizing the second measurement site are known, reference values.

7. The system of claim 1, wherein the first plurality of features is a plurality of detector signals measured in response to the detected amount of radiation from the first measurement site.

8. The system of claim 1, wherein the generating of the values of the first plurality of features characterizing the detected amount of radiation from the first measurement site involves reducing a dimension of a plurality of detector signals measured in response to the detected amount of radiation from the first measurement site.

9. The system of claim 8, wherein the reducing of the dimension of the plurality of detector signals involves any of a principal component analysis, a Fourier analysis, a wavelet analysis, and a discrete cosine transform analysis.

10. The system of claim 1, wherein the illumination source and the detector are configured as part of any of a spectroscopic ellipsometer, a spectroscopic reflectometer, a soft x-ray reflectometer, a small angle x-ray scatterometer, an imaging system, and a hyperspectral imaging system.

11. The system of claim 1, wherein the trained measurement model is any of a trained defect classification model and a trained metrology model.

12. The system of claim 1, wherein the one or more parameters of interest include any of a geometric parameter of interest, a process parameter of interest, an electrical parameter of interest, and a dispersion parameter of interest.

13. The system of claim 1, wherein the one or more parameters of interest include any of an overlay dimension, a critical dimension, a lithographic focus, and a lithographic dosage.

14. A method comprising:
providing an amount of illumination radiation directed to a first measurement site on a surface of a semiconductor wafer;
detecting an amount of radiation collected from the first measurement site in response to the amount of illumination radiation;
generating values of a first plurality of features characterizing the detected amount of radiation from the first measurement site;
estimating values of one or more parameters of interest characterizing the measurement site from the generated values of the first plurality of features of the detected amount of radiation based on a trained measurement model;
determining reconstructed values of each of the first plurality of features, wherein a reconstructed value of a feature of the first plurality of features is determined from the estimated values of the one or more parameters of interest and the generated values of each of the first plurality of features except the generated value of the feature of the first plurality of features based on a trained data reconstruction model;
estimating reconstructed values of the one or more parameters of interest characterizing the first measurement site from the reconstructed values of the first plurality of features based on the trained measurement model; and
determining a value of a quality metric based on a difference between the estimated values of the one or more parameters of interest determined from the generated values of the first plurality of features and the reconstructed values of the one or more parameters of interest determined from the reconstructed values of the first plurality of features.

15. The method of claim 14, further comprising:
normalizing the value of the quality metric.

16. The method of claim 14, further comprising: training one
or more parameters of the data reconstruction model by minimizing a difference between values of a second plurality of features of a measurement of a second measurement site different from the first measurement site and reconstructed values of the second plurality of features, wherein a reconstructed value of a feature of the second plurality of features is determined from values of the one or more parameters of interest characterizing the second measurement site and the values of the second plurality of features except the feature.

17. The method of claim 14, wherein the generating of the values of the first plurality of features characterizing the detected amount of radiation from the first measurement site involves reducing a dimension of a plurality of detector signals measured in response to the detected amount of radiation from the first measurement site.

18. The method of claim 17, wherein the reducing of the dimension of the plurality of detector signals involves any of a principal component analysis, a Fourier analysis, a wavelet analysis, and a discrete cosine transform analysis.

19. A system comprising:
- an illumination source configured to provide an amount of illumination radiation directed to a first measurement site on a surface of a semiconductor wafer;
- a detector configured to detect an amount of radiation collected from the first measurement site in response to the amount of illumination radiation; and
- a non-transient, computer-readable medium storing instructions that, when executed by one or more processors, causes the one or more processors to:
- generate values of a first plurality of features characterizing the detected amount of radiation from the first measurement site;
- estimate values of one or more parameters of interest characterizing the measurement site from the generated values of the first plurality of features of the detected amount of radiation based on a trained measurement model;
- determine reconstructed values of each of the first plurality of features, wherein a reconstructed value of a feature of the first plurality of features is determined from the estimated values of the one or more parameters of interest and the generated values of each of the first plurality of features except the generated value of the feature of the first plurality of features based on a trained data reconstruction model;
- estimate reconstructed values of the one or more parameters of interest characterizing the first measurement site from the reconstructed values of the first plurality of features based on the trained measurement model;
- determine a value of a quality metric based on a difference between the estimated values of the one or more parameters of interest determined from the generated values of the first plurality of features and the reconstructed values of the one or more parameters of interest determined from the reconstructed values of the first plurality of features; and
- normalize the value of the quality metric.

20. The system of claim 19, the non-transient, computer-readable medium further storing instructions that, when executed by the one or more processors, causes the one or more processors to:
train one or more parameters of the data reconstruction model by minimizing a difference between values of a second plurality of features of a measurement of a second measurement site different from the first measurement site and reconstructed values of the second plurality of features, wherein a reconstructed value of a feature of the second plurality of features is determined from values of the one or more parameters of interest characterizing the second measurement site and the values of the second plurality of features except the feature.

* * * * *